United States Patent
Dyer

(10) Patent No.: US 7,629,905 B2
(45) Date of Patent: Dec. 8, 2009

(54) ANALOG CORRECTION OF A PHASE-MISMATCH IN HIGH-SAMPLE RATE TIME-INTERLEAVED ANALOG-TO-DIGITAL CONVERTERS

(76) Inventor: Kenneth C. Dyer, 3040 Prado La., Davis, CA (US) 95616

( * ) Notice: Subject to any disclaimer, the term of this patent is extended or adjusted under 35 U.S.C. 154(b) by 2 days.

(21) Appl. No.: 12/009,324

(22) Filed: Jan. 16, 2008

(65) Prior Publication Data

US 2009/0002210 A1 Jan. 1, 2009

Related U.S. Application Data

(60) Provisional application No. 60/900,180, filed on Feb. 7, 2007.

(51) Int. Cl.
*H03M 1/06* (2006.01)
(52) U.S. Cl. .................................. 341/118; 341/155
(58) Field of Classification Search ................ 341/118, 341/155, 161, 120, 143
See application file for complete search history.

(56) References Cited

U.S. PATENT DOCUMENTS

| 7,068,195 | B1* | 6/2006 | Menkus | 341/141 |
| 7,233,270 | B2* | 6/2007 | Lin | 341/118 |
| 7,466,251 | B2* | 12/2008 | Uchino | 341/120 |
| 2008/0084337 | A1* | 4/2008 | Batruni | 341/118 |

* cited by examiner

*Primary Examiner*—Brian Young
(74) *Attorney, Agent, or Firm*—Dorsey & Whitney LLP

(57) ABSTRACT

A method of phase mismatch correction in high-sample rate time-interleaved analog-to-digital converters (ADC) is provided. An ADC parallel array has an output signal that is processed by a phase-mismatch detector. The detector drives a clock generator control circuit for the ADC array. The clock generator includes a common mode logic (CML) buffer, a CMOS, a non-overlapping generator, a DAC and a decimating low-pass filter. The CML receives a reference clock signal providing source line control (SLC) to the CMOS, the CMOS provides SLC to the DAC that is controlled by the filter which receives a digital control signal from the phase mismatch detector. The DAC provides a corrected timing input to the CMOS that provides the corrected timing signal to the non-overlap generator, where a delay in the clock path is modified and the signal path is unaltered.

11 Claims, 2 Drawing Sheets

ANALOG CORRECTION OF A PHASE-MISMATCH IN HIGH-SAMPLE RATE TIME-INTERLEAVED ANALOG-TO-DIGITAL CONVERTERS

CROSS-REFERENCE TO RELATED APPLICATIONS

This application is cross-referenced to and claims the benefit from U.S. Provisional Patent Application 60/900180 filed Feb. 7, 2007, which is hereby incorporated by reference.

FIELD OF THE INVENTION

The invention relates generally to analog-to-digital converters (ADC). More particularly, the invention relates to sample time mismatch correction between ADC's in an array.

BACKGROUND

High data rate communication applications require high-speed, high-resolution analog-to-digital converters (ADCs) in a time-interleaved architecture. Time-interleaved architectures provide a benefit of increased sampling rate for an analog signal. Time-interleaved ADCs also generally provide conversion-related errors due to sample time mismatches among channel ADCs that occur in timing. Sample time mismatch errors are a primary limiting factor and give rise to higher noise in the overall output.

Accordingly, there is a need to develop a way to correct timing errors inherent in the use of multiple ADCs in a time-interleaved architecture.

SUMMARY OF THE INVENTION

The current invention provides a method of phase mismatch correction in high-sample rate time-interleaved analog-to-digital converters (ADC). In one embodiment, the invention provides at least two the ADC's in a parallel array, where the ADC array has an array output signal and the array output signal is processed with a phase-mismatch detector. The phase-mismatch detector drives a control circuit for a clock generator for the ADC array, where a delay in a clock path is modified and a signal path is unaltered.

In one aspect of the invention, the control circuit includes a decimating low-pass filter of a clock generator for the ADC array, where the decimating low-pass filter controls a digital-to-analog converter (DAC).

In another aspect of the invention, the clock generator includes a common mode logic buffer, a CMOS, a non-overlapping generator, a DAC and a decimating low-pass filter. The common mode logic buffer is disposed to receive a reference clock signal from a clock generator of the ADC array and further disposed to provide source line control (SLC) to a CMOS, where the DAC is disposed to receive the SLC from the CMOS, and the DAC is controlled by the decimating low-pass filter. The filter receives a digital control signal from the phase mismatch detector, where the DAC provides a corrected timing input to the CMOS. The CMOS provides the corrected timing signal to the non-overlap generator, where a delay in the clock path is modified and the signal path is unaltered.

In a further aspect of the invention, the decimating low-pass filter is a random-walk filter.

BRIEF DESCRIPTION OF THE FIGURES

The objectives and advantages of the present invention will be understood by reading the following detailed description in conjunction with the drawing, in which.

DETAILED DESCRIPTION OF THE INVENTION

Although the following detailed description contains many specifics for the purposes of illustration, anyone of ordinary skill in the art will readily appreciate that many variations and alterations to the following exemplary details are within the scope of the invention. Accordingly, the following preferred embodiment of the invention is set forth without any loss of generality to, and without imposing limitations upon, the claimed invention.

The sample-time mismatch between any two ADC's in an array can be corrected by introducing a small correction current in the clock generator. This correction current is determined in the digital domain at a reduced sample rate by a digital circuit. The input signal bandwidth need not be limited to below half-sample frequency (FS/2) of the array sample rate. The technique can be done adaptively and in the background without interruption of the input signal.

Figure 1:
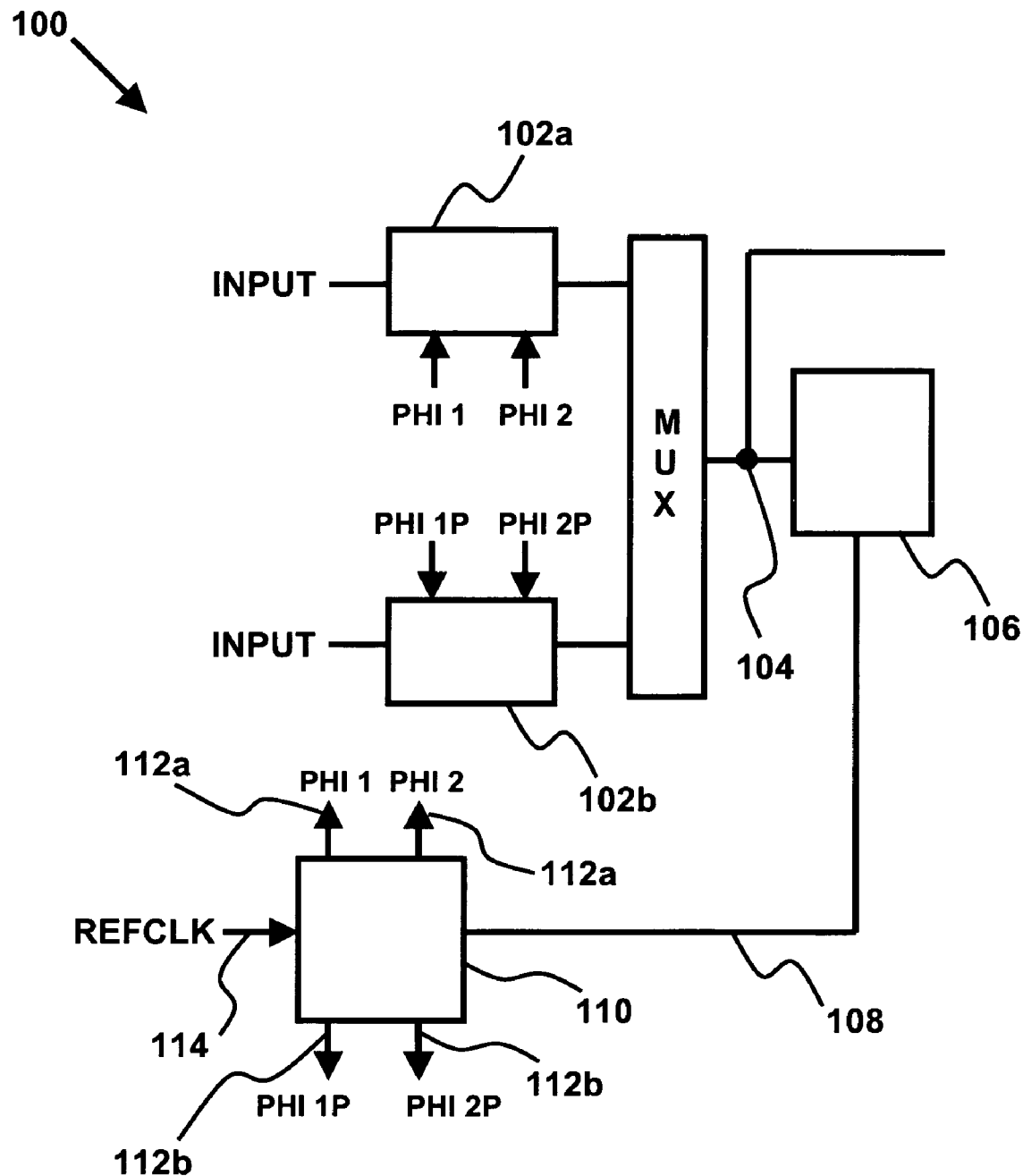
FIG. 1 shows a block diagram of the time interleaved ADC array having sample-time mismatch correction according to the present invention.

FIG. 1 shows a top-level diagram of a two-channel interleaved ADC array 100 having sample-time mismatch correction according to the present invention, where the array 100 can be extended to more than two ADC's 102(a, b). As shown, at least two the ADC's 102(a, b) are in a parallel array, where the ADC array 100 has an array output signal 104 that is processed with a phase-mismatch detector 106. The phase-mismatch detector 106 provides a digital control signal 108 to drive a control circuit 200 (see FIG. 2) for a clock generator 110 for the ADC array 100, where a delay in a clock path 112a is modified relative to clock path 112b and both are derived from clock path 114.

Figure 2:
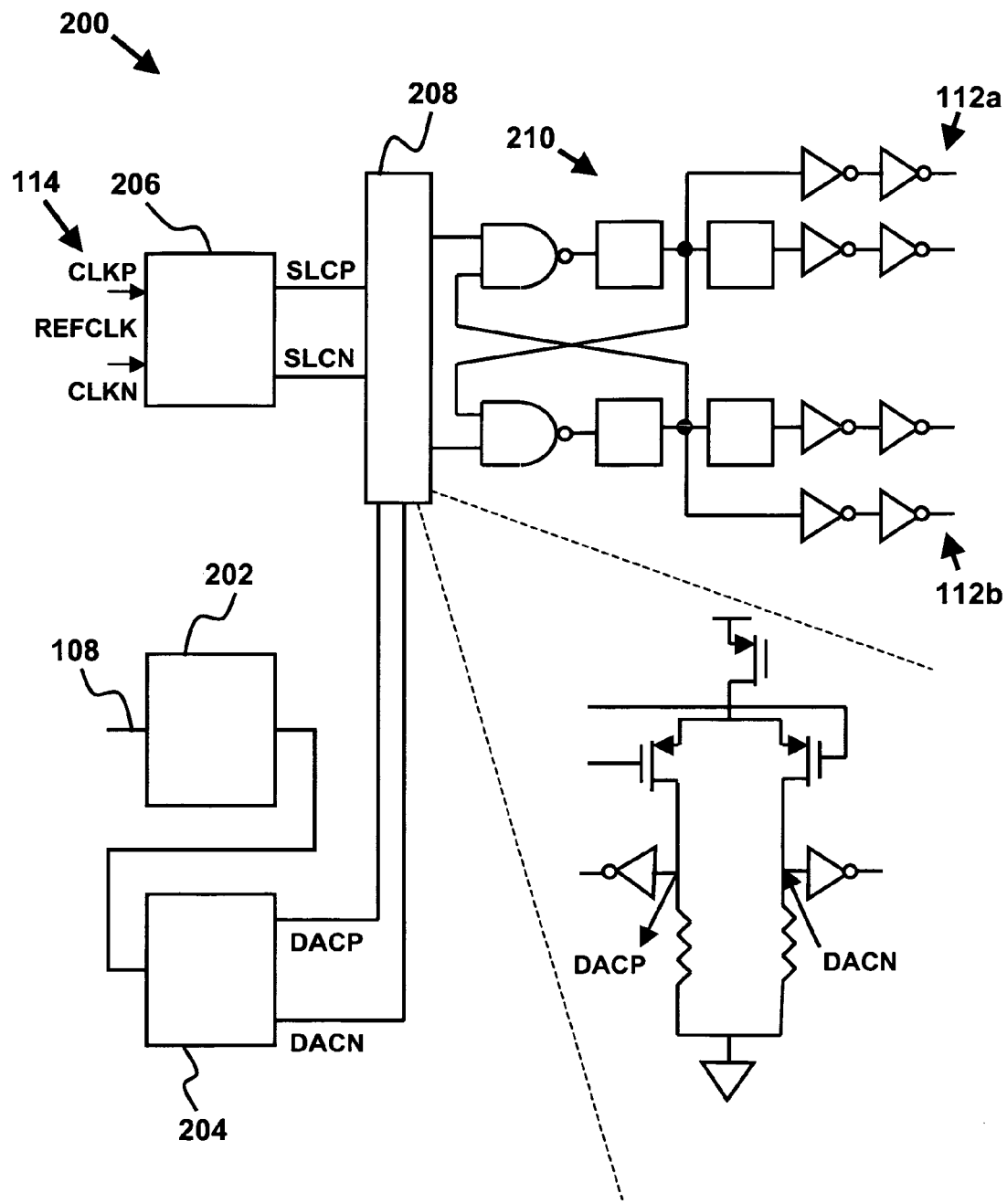
FIG. 2 shows an ADC clock generator of the time interleaved ADC array having sample-time mismatch correction according to the present invention.

FIG. 2 shows the control circuit 200 that includes a decimating low-pass filter 202 of the clock generator 110 for the ADC array 100, where the decimating low-pass filter 202 controls a digital-to-analog converter (DAC) 204. The clock generator 110 includes a common mode logic buffer 206, a CMOS 208, a non-overlapping generator 210, a DAC 204 and a decimating low-pass filter 202. The common mode logic buffer 206 is disposed to receive a reference clock signal 114 from the clock generator (not shown) of the ADC array 100 and further disposed to provide source line control (SLC) 210 to the CMOS 208, where the DAC 204 is disposed to receive the SLC 210 from the CMOS 208, and the DAC 204 is controlled by the decimating low-pass filter 202. The filter 202 receives a digital control signal 108 from the phase mismatch detector 106, where the DAC 204 provides a corrected timing input to the CMOS 208. The CMOS 208 provides the corrected timing signal to the non-overlap generator 210, where a delay in the clock path is modified and the signal path is unaltered, thus alleviating any need for use of a large high-speed digital filter that requires a bandwidth-limited input. According to one aspect of the invention, the decimating low-pass filter 202 is a random-walk filter.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example the phase-mismatch can also be determined at the wafer-sort phase by the input of a high-frequency sine wave with access to the ADC output data. The phase-mismatch detector need not be on the chip. The phase-mismatch could also be determined at "link-up" and locked in fore-ground calibration.

More than two ADC's can be calibrated if the ADCs are grouped in pairs. For example, if there are 4 ADCs in parallel, one could match ADC0 and ADC1. Then match ADC1 and ADC2, then use this technique to match the pairs of ADC. That is, match the pair ADC0, ADC1 to the pair ADC1, ADC2. This technique can be further extended to any number of time interleaved channels, when the number of ADC's are an even number.

All such variations are considered to be within the scope and spirit of the present invention as defined by the following claims and their legal equivalents.

What is claimed:

1. A method of phase mismatch correction in a time-interleaved analog-to-digital converter (ADC), the method comprising:
    providing at least two ADCs arranged in a parallel array and configured to generate an array output signal; and
    processing the array output signal with a phase-mismatch detector, wherein the phase-mismatch detector is configured to drive a control circuit for a clock generator of the array, wherein the control circuit includes a decimating low-pass filter for the clock generator, and wherein the control circuit is configured to controls a digital-to-analog converter (DAC).

2. The method of claim 1, wherein the clock generator comprises:
    a common-mode logic buffer configured to receive a reference clock signal from the clock generator and to provide a source-line control (SLC) signal;
    a CMOS circuit configured to receive the SLC signal; and
    a non-overlapping generator;
    wherein the DAC is configured to receive the SLC signal from the CMOS circuit;
    wherein the decimating low-pass filter is coupled to the DAC; and
    wherein the decimating low-pass filter is configured to receive a digital control signal from the phase mismatch detector, wherein the DAC is configured to provide a corrected timing input signal to the CMOS circuit, and wherein the CMOS circuit is further configured to provide the corrected timing signal to the non-overlapping generator.

3. The method of claim 1, wherein the decimating low-pass filter comprises a random-walk filter.

4. An interleaved analog-to-digital converter (ADC) array comprising:
    a plurality of ADCs arranged in a parallel array, each ADC configured to operate in accordance with a respective clock signal, wherein the plurality of ADCs are further configured to provide at least one output signal;
    a clock generator coupled to the plurality of ADCs and configured to couple the respective clock signals to the ADCs, wherein the clock generator includes clock generation circuitry and a control circuit, and wherein the control circuit comprises:
        a digital-to-analog converter (DAC);
        a decimating low-pass filter coupled to and configured to control the DAC; and
        a phase-mismatch detector configured to receive the output signal and to couple a control signal to the decimating low-pass filter, wherein the DAC is configured to couple a corrected timing signal, based in part on the control signal, to the clock generation circuitry.

5. The interleaved ADC array of claim 4, wherein the decimating low-pass filter comprises a random-walk filter.

6. The interleaved ADC array of claim 4, wherein the clock generation circuitry comprises at least one non-overlapping clock generator.

7. The interleaved ADC array of claim 6, wherein the clock generation circuitry comprises:
    a common-mode logic buffer; and
    CMOS circuitry coupled to both the non-overlapping clock generator and the common-mode logic buffer, wherein the CMOS circuitry is configured to receive a source-line control signal from the common-mode logic buffer and the corrected timing signal from the DAC.

8. A method for correcting phase mismatch in a time-interleaved analog-to-digital converter (ADC), the method comprising:
    detecting a phase mismatch based, at least in part, on a digital signal output from the ADC;
    generating a digital control signal based, at least in part, on the phase mismatch;
    converting the digital control signal to an analog corrected timing signal; and
    adjusting a delay of at least one clock signal associated with the time-interleaved ADC in response to the analog corrected timing signal.

9. The method of claim 8, further comprising filtering the digital control signal.

10. The method of claim 8, wherein said converting the digital control signal comprises generating a corrected timing current in response to the digital control signal.

11. The method of claim 10, wherein said adjusting a delay comprises introducing the corrected timing current into a clock generator associated with the ADC.

* * * * *

UNITED STATES PATENT AND TRADEMARK OFFICE
CERTIFICATE OF CORRECTION

PATENT NO. : 7,629,905 B2 Page 1 of 1
APPLICATION NO. : 12/009324
DATED : December 8, 2009
INVENTOR(S) : Kenneth C. Dyer It is certified that error appears in the above-identified patent and that said Letters Patent is hereby corrected as shown below:

| Column, Line | Reads | Should Read |
|---|---|---|
| Column 3, Line 36 | "the control circuit is configured to controls a digital-to-" | the control circuit is configured to control a digital-to- |

Signed and Sealed this

Second Day of March, 2010

David J. Kappos
*Director of the United States Patent and Trademark Office*